(12) United States Patent
Wang et al.

(10) Patent No.: US 12,446,236 B2
(45) Date of Patent: Oct. 14, 2025

(54) RESISTIVE RANDOM-ACCESS MEMORY USING STACKED TECHNOLOGY

(71) Applicant: W&Wram Devices, Inc., Los Altos, CA (US)

(72) Inventors: Shih-Yuan Wang, Palo Alto, CA (US); Shih-Ping Wang, Los Altos, CA (US)

(73) Assignee: W&Wram Devices, Inc., Los Altos, CA (US)

( * ) Notice: Subject to any disclaimer, the term of this patent is extended or adjusted under 35 U.S.C. 154(b) by 408 days.

(21) Appl. No.: 18/025,971

(22) PCT Filed: Sep. 13, 2021

(86) PCT No.: PCT/US2021/049991
§ 371 (c)(1),
(2) Date: Mar. 13, 2023

(87) PCT Pub. No.: WO2022/056345
PCT Pub. Date: Mar. 17, 2022

(65) Prior Publication Data
US 2023/0354620 A1 Nov. 2, 2023

Related U.S. Application Data

(60) Provisional application No. 63/228,497, filed on Aug. 2, 2021, provisional application No. 63/131,269, filed (Continued)

(51) Int. Cl.
*H10B 80/00* (2023.01)
*H01L 23/00* (2006.01)
(Continued)

(52) U.S. Cl.
CPC ............ *H10B 80/00* (2023.02); *H01L 24/08* (2013.01); *H01L 25/0657* (2013.01); *H01L 25/18* (2013.01); *H10B 63/00* (2023.02); *H10N 70/046* (2023.02); *H10N 70/24* (2023.02); *H01L 2224/08145* (2013.01); *H01L 2924/1431* (2013.01); *H01L 2924/1443* (2013.01)

(58) Field of Classification Search
None
See application file for complete search history.

(56) References Cited

U.S. PATENT DOCUMENTS 7,812,335 B2 * 10/2010 Scheuerlein ......... H10N 70/883
257/4
8,659,001 B2 * 2/2014 Wang ..................... H10B 63/80
257/E45.001

(Continued)

OTHER PUBLICATIONS

International Search Report and Written Opinion in PCT/US2021/049991, mailed Dec. 16, 2021.

*Primary Examiner* — Hung K Vu
(74) *Attorney, Agent, or Firm* — Wissing Miller LLP

(57) ABSTRACT

Resistive RAM (RRAM) devices having increased reliability and related manufacturing methods are described in combination with stacked technology with CMOS ASIC wafters. Greater reliability of RRAM cells over time can be achieved by avoiding direct contact of metal electrodes with the device switching layer. Stacking technology can be used to address incompatibility of ReRAM processing and CMOS ASICs processing.

20 Claims, 9 Drawing Sheets

Related U.S. Application Data on Dec. 28, 2020, provisional application No. 63/106,237, filed on Oct. 27, 2020, provisional application No. 63/091,206, filed on Oct. 13, 2020, provisional application No. 63/082,404, filed on Sep. 23, 2020, provisional application No. 63/077,510, filed on Sep. 11, 2020.

(51) Int. Cl.
| | | |
|---|---|---|
| *H01L 25/065* | (2023.01) | |
| *H01L 25/18* | (2023.01) | |
| *H10B 63/00* | (2023.01) | |
| *H10N 70/00* | (2023.01) | |
| *H10N 70/20* | (2023.01) | |

(56) References Cited

U.S. PATENT DOCUMENTS

| | | | |
|---|---|---|---|
| 2009/0302296 A1* | 12/2009 | Fuchigami | H10N 70/8833 257/E47.001 |
| 2013/0075683 A1 | 3/2013 | Fowler | |
| 2014/0264238 A1 | 9/2014 | Jo | |
| 2015/0035756 A1 | 2/2015 | Ahn | |
| 2018/0375021 A1 | 12/2018 | Wang | |
| 2020/0006650 A1 | 1/2020 | Wang | |

* cited by examiner

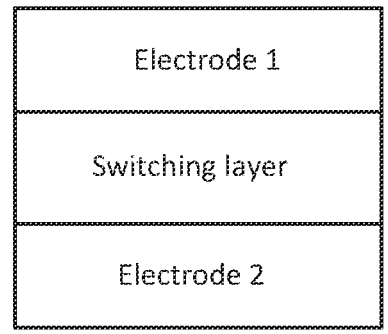
FIG. 2A
(prior art)
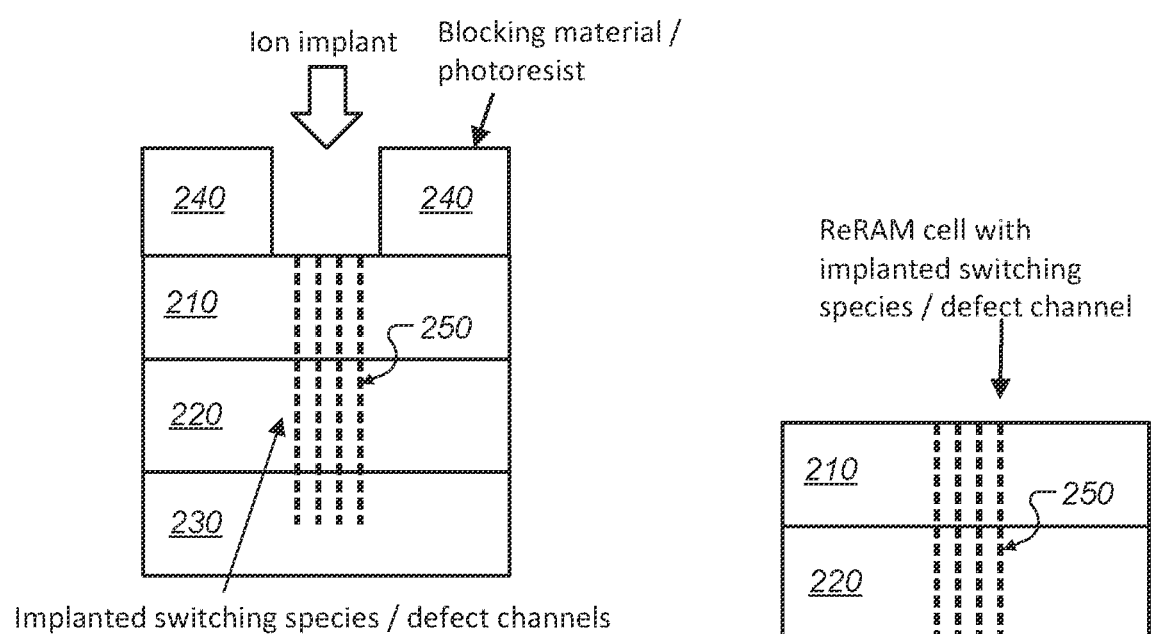
FIG. 2B
FIG. 2C

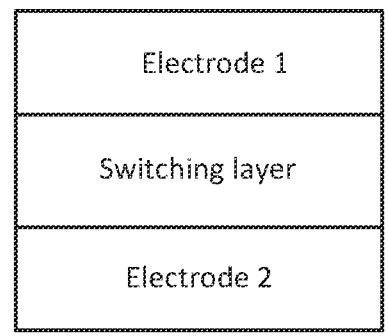
FIG. 3A
(prior art)
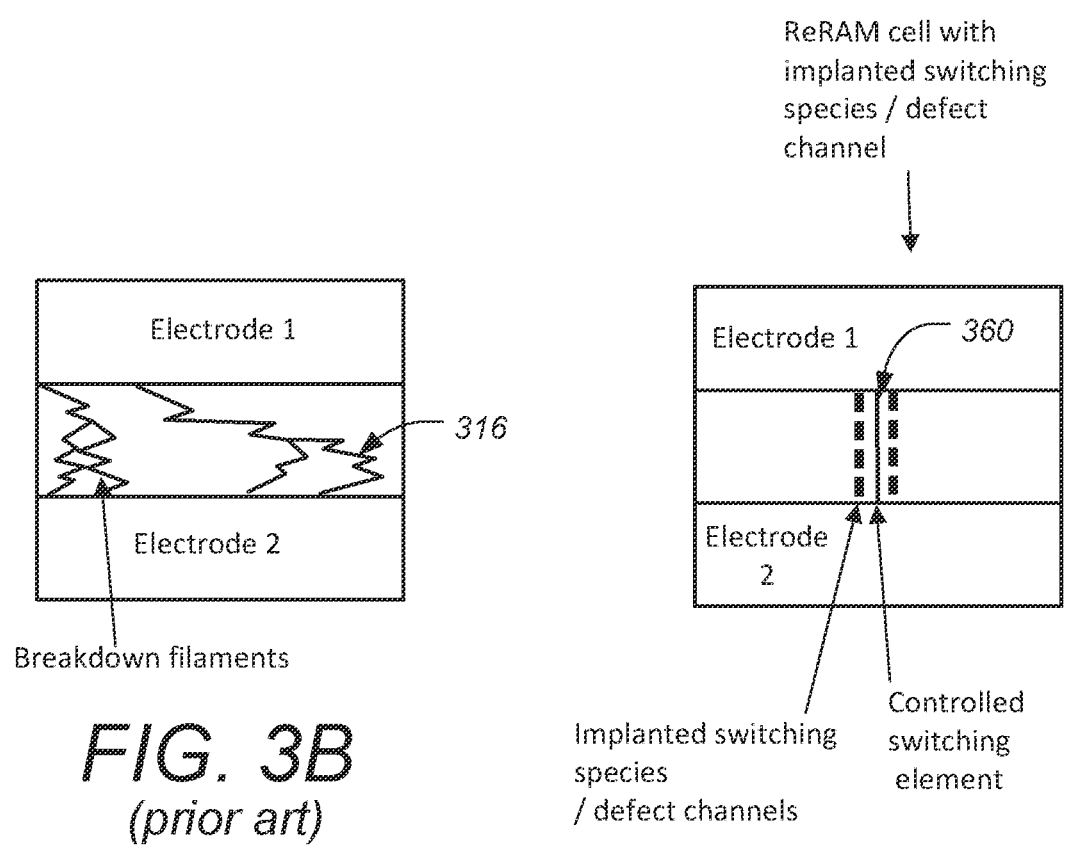
FIG. 3B
(prior art)
FIG. 3C

Forming Process

No Forming Process

High switching current

Low switching current < 10 μA

RESISTIVE RANDOM-ACCESS MEMORY USING STACKED TECHNOLOGY

REFERENCE TO RELATED APPLICATIONS

This patent application claims the priority of and incorporates by reference each of the following provisional patent applications:
U.S. Prov. Ser. No. 63/077,510 filed Sep. 11, 2020;
U.S. Prov. Ser. No. 63/082,404 filed Sep. 23, 2020;
U.S. Prov. Ser. No. 63/091,206 Oct. 13, 2020;
U.S. Prov. Ser. No. 63/106,237 Oct. 27, 2020;
U.S. Prov. Ser. No. 63/131,269 Dec. 28, 2020; and
U.S. Prov. Ser. No. 63/228,497 Aug. 2, 2021.

Additionally, this patent application is related to and incorporates by reference each of the following patents and patent applications:
U.S. Pat. No. 10,756,266 granted on Aug. 25, 2020, having U.S. application Ser. No. 16/537,062 filed Aug. 9, 2019;
U.S. Pat. No. 10,381,557 granted on Aug. 13, 2019, having U.S. application Ser. No. 16/062,414 filed Jun. 14, 2018;
U.S. Pat. No. 9,978,939 granted on May 22, 2018, having U.S. application Ser. No. 15/446,626 filed Mar. 1, 2017;
U.S. Pat. No. 9,647,036 granted on May 9, 2017, having U.S. application Ser. No. 15/010,450 filed Jan. 29, 2016;
U.S. Pat. No. 9,515,262 granted on Dec. 6, 2016, having U.S. application Ser. No. 14/829,327 filed Aug. 18, 2015;
International Patent Application Ser. No. PCT/US2015/45731 filed Nov. 25, 2015; and
International Patent Application Ser. No. PCT/US2014/039990 filed May 29, 2014.

FIELD

This patent specification generally relates mainly to resistive random-access memory devices. More particularly, some embodiments relate to all-silicon resistive random-access memory having switching regions that do not contact metal electrodes.

BACKGROUND

Resistive Random Access Memory (ReRAM) is a non-volatile memory that can come in several different forms such as Memristor, Ox ReRAM consisting of oxygen vacancy movements and transition metal oxide (TMO) Ions or bulk ionic switching and conductive bridge ReRAM (CBReRAM). See for example Chen, ReRAM: History, Status, and Future, IEEE Transactions on Electron Devices, Vol. 67, NO. 4, April 2020, which is incorporated by reference herein and hereinafter referred to as "Chen." As discussed in Chen, the ReRAM processing in many ways can be incompatible with CMOS ASICs/Logic/Processor process and can present a significant challenge in manufacturing. In addition, forming process is discussed in Chen where a soft dielectric breakdown voltage is often applied to each ReRAM memory cell to initiate high resistance state (HRS) and low resistance states (LRS) memory characteristics. This can cause manufacturing delays, non-uniformity of memory cells, non-repeatability, and/or unpredictable switching characteristics, which all reduce yield and prevent mass production of such ReRAM devices. In addition, metal electrodes used for prior art ReRAM can introduce impurities and/or metal ions that can eventually cause the ReRAM cell to fail.

The subject matter claimed herein is not limited to embodiments that solve any specific disadvantages or that operate only in environments such as those described above. Rather, this background is only provided to illustrate one exemplary technology area where some embodiments described herein may be practiced.

SUMMARY

According to some embodiments, a stacked device comprises: an active transistor circuit; a resistive random-access memory stacked on and integrated with the active transistor circuit, wherein the resistive random-access memory comprises: top and bottom electrodes and a switching layer between the top electrode and the bottom electrode; a switching region that is within said switching layer and is laterally flanked by portions of said switching layer that are not a switching region; wherein said switching region is formed by ion implantation into the switching layer through at least one of the top electrode and bottom electrode; wherein said switching region is configured to switch between high and low electrical conductivity in response to the application of a switching voltage without a need of applying a breakdown voltage to form said switching region; and said stacked device further comprises a connecting electrode electrically coupling at least one of the top electrode and the bottom electrode to the active transistor circuit.

According to some embodiments, said stacked device can include one or more of the following features: (a) said switching region has a substantially constant cross-section from one to the other of said top and bottom electrodes; (b) the switching region is formed by implanting switching species into a non-switching material; (c) the switching region is formed by selective ion implantation to cause the switching region to have a width in a plane intermediate the top and bottom electrodes that controls the value of a switching current of the device; (d) selected ions are implanted into the switching region to break or reduce an oxygen bond from a transition metal ion switching species; and (e) Argon, Xenon, and/or Neon ions have been implanted in said switching region to break or reduce an oxygen bond from a transition metal ion switching species.

According to some embodiments, a stacked device comprises: an active transistor circuit; a resistive random access memory stacked on and integrated with the active transistor circuit and comprising: top and bottom electrodes and a layer of non-switching material into which switching species have been implanted to form a switching channel; wherein said material has an area in planes along said top and bottom electrodes and said switching channel area in said planes is less than that of said material; wherein said switching channel is configured to switch between high and low electrical conductivity in response to the application of a switching voltage below a breakdown voltage without a need of applying a breakdown voltage to form said switching channel; and the stacked device further comprises a connecting electrode electrically coupling at least one of the top electrode and the bottom electrode to the active transistor circuit.

The device described in the immediately preceding paragraph can further include one or more of the following features: (a) said area of said switching channel is selected to control current flowing through the channel when the channel is in a state of high conductivity; (b) said area of said switching channel is selected to control a value of a switching voltage sufficient to change the channel between high and low conductivity; (c) Argon, Xenon, and/or Neon ions have been implanted in said switching region to break or reduce an oxygen bond from a transition metal ion switching species; (d) said switching species have been implanted through at least one of said top and bottom electrodes; and (e) said switching channel has a substantially constant cross-section from one to the other of said top and bottom electrodes.

According to some embodiments, a method of forming a stacked device comprises: providing a stack of a semiconductor material having a first layer for a resistive random-access memory and a second layer for an active transistor circuit; forming a connecting electrode that extends from a region of the second layer toward a region of the first layer and a bottom electrode that is at a region of the first layer and merges with a top of said connecting electrode and top electrode at an upper region of the first layer; ion implanting through the top electrode and into the material of the first layer to form a switching region extending from the top to the bottom electrodes and flanked by said material of the first layer at least on two sides; wherein said switching region is configured to switch between high and low electrical conductivity in response to the application of a switching voltage without a need of applying a breakdown voltage to form said switching region; and wherein the step of forming the switching region comprises forming the switching region with a substantially constant width from said top electrode to said bottom electrode.

The method can further include one or more of the following steps; (a) bonding said first and second layers to each other; (b) selecting said width of the switching region to match a selected switching voltage for switching the switching region between said high and low conductivities; (c) selecting said width of the switching region to match a selected current flow through said switching region in a state thereof of said high conductivity; (d) said providing the first layer comprises providing a layer of a non-switching material and said ion implanting comprises implanting switching species in said first layer to thereby form or complete said switching region; and (e) implanting Argon, Xenon, and/or Neon ions in said switching region to break or reduce an oxygen bond from a transition metal ion switching species.

According to some embodiments, a method of forming a stacked device comprises: providing a stack of a semiconductor material having a first layer for a resistive random-access memory and a second layer for an active transistor circuit; wherein said first layer is a non-switching material; forming a connecting electrode that extends from a region of the second layer toward a region of the first layer and a bottom electrode that is at a region of the first layer and merges with a top of said connecting electrode and top electrode at an upper region of the first layer; ion implanting switching species through the top electrode and into the material of the first layer to form a switching region extending from the top to the bottom electrodes and flanked by said non-switching material of the first layer at least on two sides; wherein said switching region is configured to switch between high and low electrical conductivity in response to the application of a switching voltage without a need of applying a breakdown voltage to form said switching region.

The method described in the immediately preceding paragraph can further include forming the switching region with a substantially constant width from said top electrode to said bottom electrode.

BRIEF DESCRIPTION OF THE DRAWINGS

To further clarify the above and other advantages and features of the subject matter of this patent specification, specific examples of embodiments thereof are illustrated in the appended drawings. It should be appreciated that these drawings depict only illustrative embodiments and are therefore not to be considered limiting of the scope of this patent specification or the appended claims. The drawings illustrating devices are not to scale and show in straight lines surfaces and interfaces that in actual devices would not be as linear or planar. The subject matter hereof will be described and explained with additional specificity and detail through the use of the accompanying drawings in which:

FIG. 2A shows a partial simple schematic cross section of a ReRAM cell as fabricated in prior art ReRAM devices;

FIG. 2B shows a simple partial cross section of a ReRAM cell, according to some embodiments;

FIG. 2C shows a simple partial cross section of a \re\RAM cell with an implanted switching species/defect channel, according to some embodiments.

FIG. 3A shows an as fabricated ReRAM cell prior to the formation of switching filaments;

FIG. 3B shows a simple partial schematic cross section of a ReRAM cell that has gone through a forming process according to known processes;

FIG. 3C shows a partial simple cross section schematic of a ReRAM cell, according to some embodiments;

DETAILED DESCRIPTION

A detailed description of examples of preferred embodiments is provided below. While several embodiments are described, it should be understood that the new subject matter described in this patent specification is not limited to any one embodiment or combination of embodiments described herein, but instead encompasses numerous alternatives, modifications, and equivalents. In addition, while numerous specific details are set forth in the following description in order to provide a thorough understanding, some embodiments can be practiced without some or all of these details. Moreover, for the purpose of clarity, certain technical material that is known in the related art has not been described in detail in order to avoid unnecessarily obscuring the new subject matter described herein. It should be clear that individual features of one or several of the specific embodiments described herein can be used in combination with features or other described embodiments. Further, like reference numbers and designations in the various drawings indicate like elements.

Figure 1A:
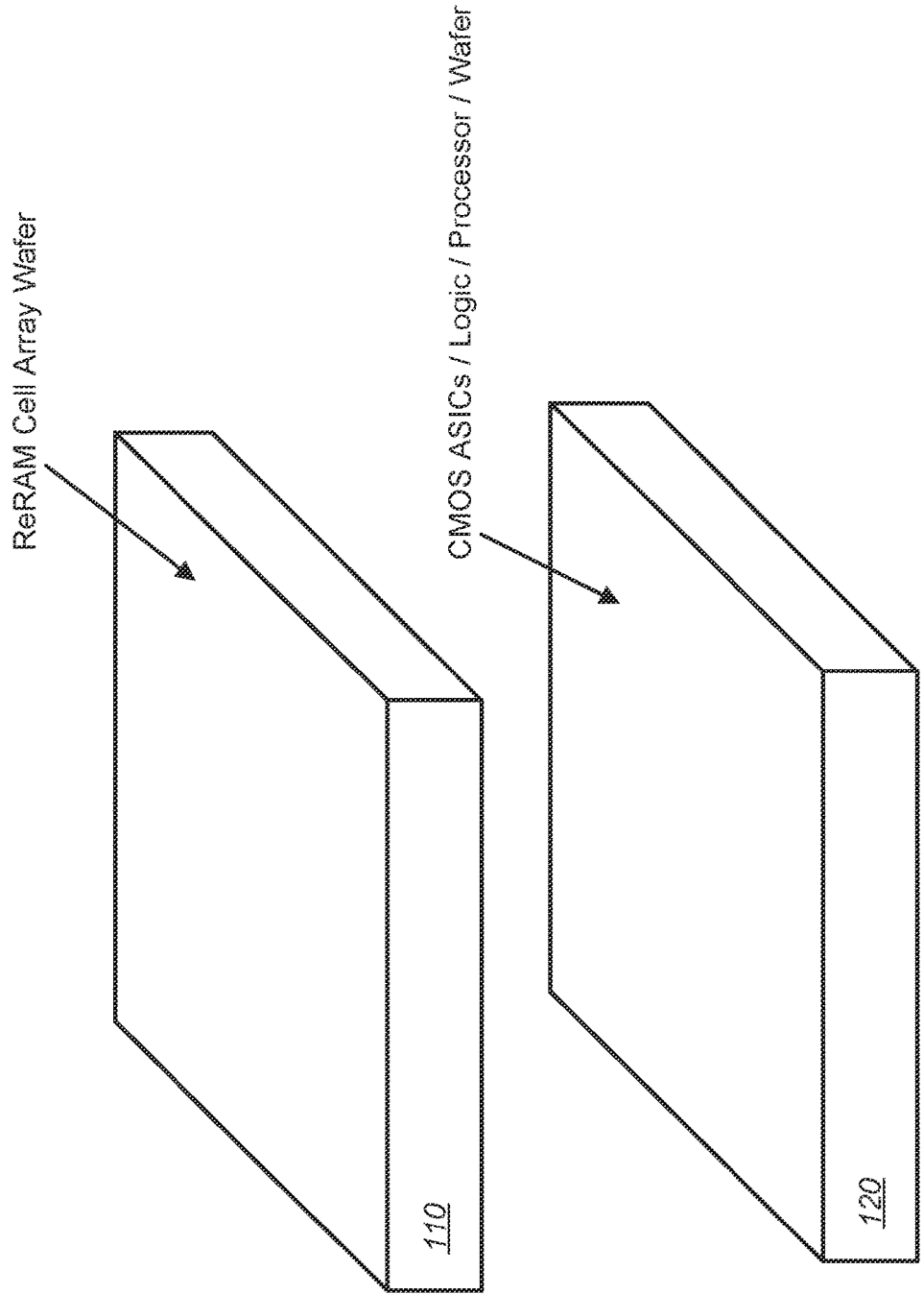
FIG. 1A shows a simple partial schematic of stacked technology used with ReRAM and CMOS ASIC wafters, according to some embodiments.

FIG. 1A shows a simple partial schematic of stacked technology used with ReRAM and CMOS ASIC wafters, according to some embodiments. Stacking technology can be used to address incompatibility of ReRAM processing and CMOS ASICs. For further detail of stacking technology, see, e.g. Haruta et. al, A 1/2.3 inch 20M pixel 3-Layer Stacked CMOS Image Sensor with DRAM, IEEE International Solid-State Circuits Conference, Feb. 6, 2017, which is incorporated by reference herein. Haruta et. al discusses a CMOS image sensor wafer fabricated separately from CMOS ASICs wafer and CMOS DRAM (Dynamic Random Access Memory) wafers that are then bonded together to form a single unit. Referring to FIG. 1A, one or more ReRAM cell array wafers 110 can be stacked with CMOS ASICs/Logic/Processor wafer 120 to form a single unit.

Figure 1B:
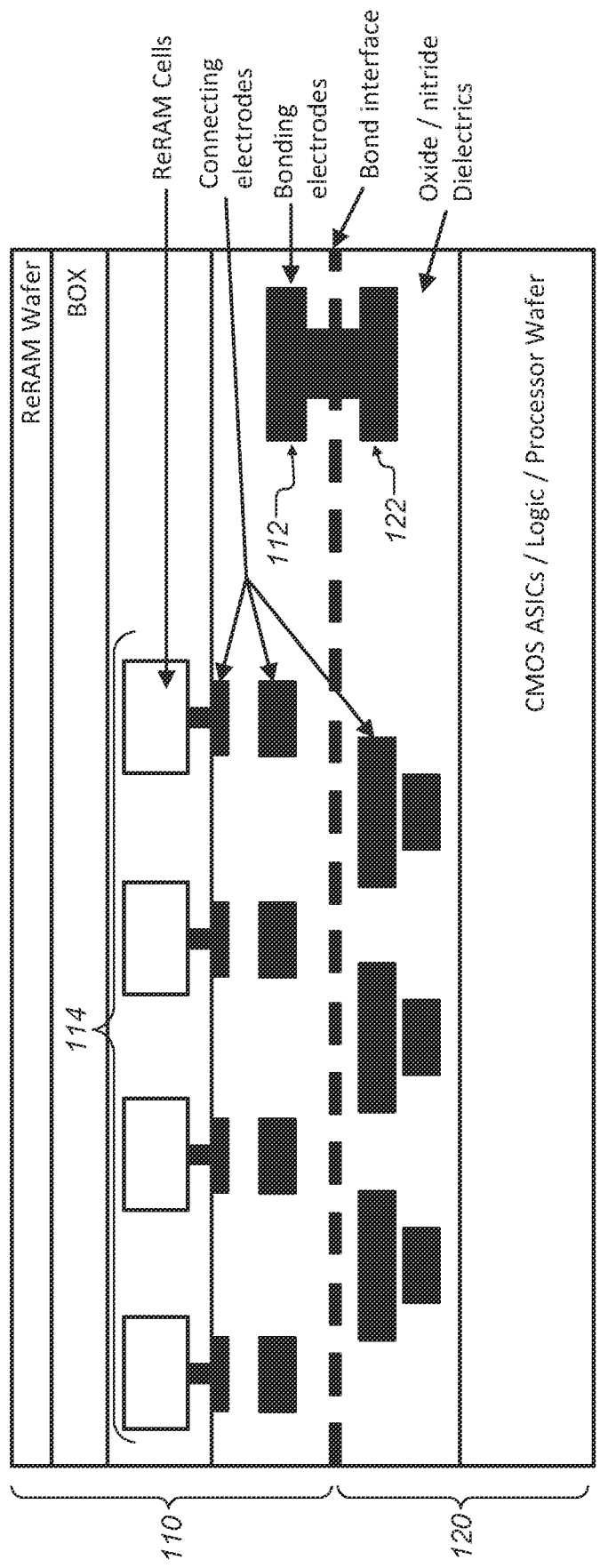
FIG. 1B shows a simple partial cross section schematic of a ReRAM wafer fabricated on Silicon on insulator (SOI) for example stacked on top of a CMOS ASICs/Logic/Processor wafer, according to some embodiments.

FIG. 1B shows a simple partial cross section schematic of a ReRAM wafer fabricated on Silicon on insulator (SOI) for example stacked on top of a CMOS ASICs/Logic/Processor wafer, according to some embodiments. Bonding electrodes 112 of the ReRAM cell array 114 can be bonded to bonding electrodes 122 of the CMOS ASICs/Logic/Processor wafer 120 such that electrical connections can be made between the ReRAM wafer 110 and CMOS ASICs wafer 120 for data communication such as re-write, erase for example. For simplicity, FIG. 1B shows only one ReRAM wafer 110 bonded to the CMOS ASICs wafer 120. According to some embodiments, multiple ReRAM wafers 110 can be stacked or bonded to the CMOS ASICs/Logic/Processor wafer 120 with the appropriate bonding and connecting electrodes.

The proximity of the CMOS ASICs/logic/processor to the ReRAM array 114 allows high transmission efficiency and speed between the ReRAM array 114 and the CMOS ASICs/logic/processor on wafer 120. Such arrangement allows the ReRAM memory to be embedded with logic/processors allowing more efficient computing.

As transistors approach sub-10 nanometer critical dimensions, further scaling following Moore's Law may be difficult. Hyper scaling may require non-volatile memories such as ReRAM due to the simplicity in construction and stackability into three-dimensional structures with CMOS logic/processors. See, e.g. Siemon et. al, Stateful Three-Input Logic with Memristive Switches, Scientific Reports, Nature, Oct. 10, 2019, which is incorporated by reference herein. Siemon et. al discusses logic elements/processors being constructed with memristive elements such as ReRAM. Such usage of memristive elements for computing purposes can also simplify design of logic circuits due to the simplicity of the memristive elements.

FIGS. 2A-2C are simple partial schematic cross sections of ReRAM cells with the inclusion of ion implanted defect channels and switching species into switching layer or layers. The switching layer or layers 220 can be a stoichiometric material such as Si dioxide, Al oxide, Si nitride, to name a few, and with high purity electrodes 210 and 230 such as doped P or N type Si, Al, for example. The goal for ion implanted switching channels and species is to eliminate as much as possible and/or completely the forming process which requires a soft dielectric breakdown to initiate memristive behavior as discussed in reference Chen.

FIG. 2A shows a partial simple schematic cross section of a ReRAM cell as fabricated in prior art ReRAM devices consisting of electrode 1 and electrode 2 and a switching layer which in most cases are not Stoichiometric and at least one electrode is a transition metal electrode such as Ti, Ta, V to name a few and often a soft dielectric breakdown is used to initiate memristive/reman characteristics. Such dielectric breakdown process is random in nature and can cause non-uniformity in the on-off voltages, high resistance state (HRS) and low resistance state (LRS), and repeatability and reproducibility. Often the switching current is in the range of 50-200 microamperes (see, e.g., Chen) and is too high for most high density memory applications. Switching current of 10 microamperes or less is desirable and consistent, repeatable, uniform switching currents are desired for high density ReRAM memory arrays (see, e.g., Chen)

FIG. 2B shows a simple partial cross section of a ReRAM cell, according to some embodiments. The Stoichiometric switching layer 220 can be a material such as Si dioxide with a high purity electrode 1 (210) and electrode 2 (230) that can be Al, doped Si for example, The selective ion implantation is performed preferably in the center of the ReRAM cell only, and a blocking layer such as photoresist 240 and any other dielectric such as Si dioxide for example can be used to shield part of the ReRAM cell from the ion implanted species. The ion implant beam can be a blanket beam, and can be swept across the wafer that consists of the ReRAM memory arrays. The ion beam can include or consist of ions such as He, Ar, Ze, H, and/or multiple combinations of ions and/or one or multiple combinations of ion implant energies to create a defect channel through the Stoichiometric switching layer entirely and/or partially in the Stoichiometric switching layer.

Switching species 250 such as O, N, Ti, Ta, Hf, V, Ni, W, Nb, to name a few can also be ion implanted in one or more species. Often O and or N are co-implanted with transition metal ion or ions to allow memristive/ReRAM characteristics. In some cases, the switching species 250 itself can be used to generate the defect channels. One or multiple ion implant energies can be used with the multiple switching species to allow a staggered placement of the switching species within the switching layer and in some cases within the electrodes which can act as a controlled reservoir for the switching species. Ion implantation is commonly used in CMOS process and the purity of the switching species can be tightly controlled such as with the density and spatial location of the switching species within the ReRAM cell to define a controlled memristive ReRAM switching behavior and controlled current. The controlled switching current can range from 10 s of nanoamps to less than 10 microamps, and in some cases where higher switching currents are desired can range from 10 s of microamps to 100 microamps or more. With ion implanted switching species in a high purity ReRAM cell of both electrodes and switching layer, uniform, predictive, reproducible, high endurance ReRAM cells can be produced that are suitable for ultra high density ReRAM memory arrays without the use of soft dielectric breakdown process.

FIG. 2C shows a partial simple schematic cross section of a completed ion implanted ReRAM cell, according to some embodiments. Memristive/ReRAM characteristics occurs at the center of the ReRAM cell along the ion implanted defined switching channels.

In some cases, the switching layer 220 can be non-stoichiometric such that it can have an excess of oxygen vacancies for example and an excess of transition metal ions where ion implantation of either inert ions and/or switching species such as O, and/or transition metal ions can be implanted into the switching layer partially or fully, and in some cases to the bottom electrode 230, electrode 2. The action of ion implantation can create a switching channel such that bias voltages below the dielectric breakdown voltage can be applied to initiate memristive/ReRAM characteristics such as HRS and LRS states. As discussed, the ReRAM are oxygen based ReRAM and the same process can be applied to non oxygen ReRAM such as nitride ReRAM, carbite ReRAM, hydrogen ReRAM to name a few, and in some cases also to conductive bridge RAM or ReRAM (CBRAM/CBRERAM) where the changing resistivity is by the movement and formation of metal ions.

Chen discussed forming process which he calls a soft dielectric breakdown for filamentary ReRAM such as vacancies causing the switching behavior or metal ions causing the switching behaviors. The filamentary ReRAM according to Chen has the highest memory retention in excess of 10 years at an elevated temperature and the highest durability in terms of switching cycles, often greater than 1 billion cycles or more, and in some cases 1 trillion cycles. However due to the forming process or soft dielectric breakdown the switching current is hard to control and often in excess of 100 microamps.

FIG. 3A shows an as-fabricated ReRAM cell prior to the formation of switching filaments. FIG. 3B shows a simple partial schematic cross section of a ReRAM cell that has gone through a forming process according to known processes. According to Chen, a forming process involves soft dielectric breakdown or a dielectric breakdown of the switching layer. Such dielectric breakdown generates unpredictable breakdown paths 316 which the switching filaments will more or less follow. Often the breakdown process initiates at a sharp edge of an electrode, or sharp points in the electrode and follows a random path to the opposing electrode where a bias voltage is applied, and the bias voltage applied is the breakdown voltage (BV). Such an uncontrolled and random breakdown process results in difficulty in creating a reproducible switching current among the multitude of ReRAM cells which can often exceed 1 billion or more in a typical memory application and in some cases in embedded memories exceeding hundreds of millions of ReRAM cells, and in some cases for storages exceeding trillions of ReRAM cells. Also, multiple switching filaments 316 are randomly formed during a breakdown process and controlling the switching current to 10 microamps or less is often difficult to reproduce. As discussed earlier this random soft dielectric breakdown process, also called forming process by reference Chen, results in non-uniformity of switching current, on—off voltages, HRS and LRS states or resistances, reproducibility, repeatability among different ReRAM cells of a memory or logic array.

FIG. 3C shows a partial simple cross section schematic of a ReRAM cell, according to some embodiments. The ReRAM cell in this case is formed by CMOS quality and purity ion implantation process as discussed in FIG. 2B and FIG. 2C where ion purity can be controlled to better than 1 part per million, and in some cases better than 1 part per billion. The switching filament 360 (or filaments) can be precisely placed in a ReRAM cell such as the center of the cell for example and the width and number of switching elements can be precisely controlled such that the switching current can be precisely controlled to 10 microamps or less for example, and in some cases nanoamps with high reproducibility and repeatability to within a few percent, and in some cases to 1% or less. The switching voltages such as the on-off voltage, the switching current, the HRS and LRS states or resistances can be controlled to within a few percent and in some cases to 1% or less. Such uniformity and reproducibility and repeatability are critical in high density memory arrays with array size from a few million to a few trillion, and for logic applications.

Figure 4A:
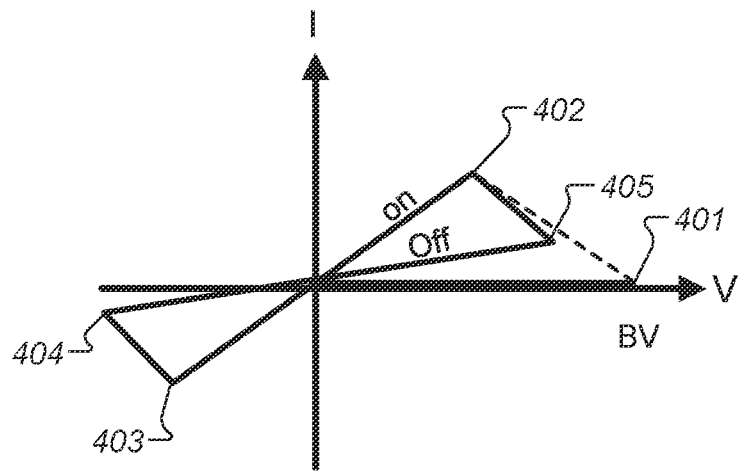
FIG. 4A shows a simple schematic of a ReRAM cell that uses a bias voltage to the dielectric breakdown voltage (BV) before any HRS and LRS characteristic can be observed.
Figure 4B:
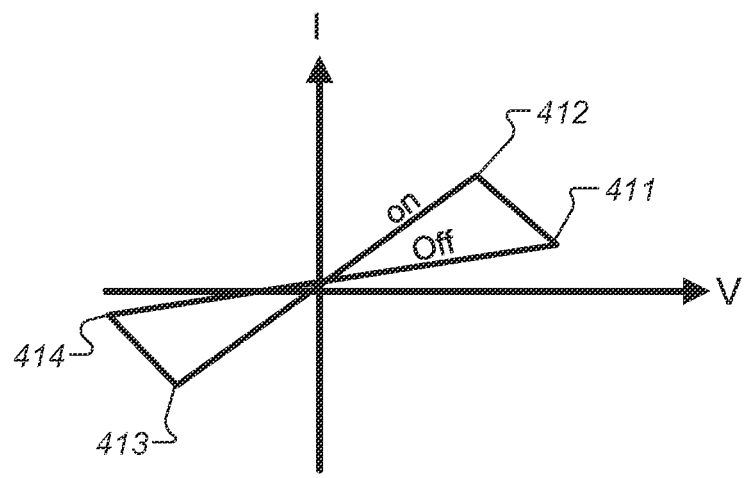
FIG. 4B shows a simple schematic of ReRAM characteristics without dielectric breakdown, according to some embodiments.

FIGS. 4A and 4B show simple schematics of the current (I) voltage (V) characteristics of ReRAM devices. A comparison is made between a ReRAM cell formed using a dielectric breakdown voltage to initiate to ReRAM characteristics and a ReRAM cell exposed to ion implantation to form a precise switching filament without the need of a dielectric breakdown process.

FIG. 4A shows a simple schematic of a ReRAM cell that uses a bias voltage to the dielectric breakdown voltage (BV) before any HRS and LRS characteristic can be observed. Once the breakdown voltage 401 is applied the resistance snaps to a LRS or on state (402) and as in a bipolar ReRAM cell as the voltage is decreased past the origin to a negative voltage or a polarity opposite the breakdown polarity (403) the ReRAM cell will switch to a HRS or off state (404) and as the voltage decreases and passes through the origin and reaches position 405 it reverts back to the on state or LRS. This is just a simple example of a ReRAM and the voltage polarities can be switched for example instead of a positive breakdown voltage it can be a negative breakdown voltage. There are many examples of ReRAM characteristics some of which may exhibit non linear IV characteristics, and some ReRAM may be unipolar.

FIG. 4B shows a simple schematic of ReRAM characteristics without dielectric breakdown, according to some embodiments. 411 is the reset voltage to low resistance state. 412 is the low resistance state (On). 413 is the reset voltage to high resistance state. 414 is the high resistance state (Off). Upon bias with bias voltages less than the soft dielectric breakdown voltage (BV) a high resistance state or off state can be observed and with further bias a low resistance state or on state can be observed. Such a ReRAM characteristics can be observed with ReRAM cells exposed to selective area ion implantation where precise switching channels can be defined and where precise switching species can be deposited within the switching layer and/or into the electrode. In some cases, just the introduction of selective area ion implantation into the switching layer can result in a ReRAM cell to exhibit a HRS/LRS characteristics at voltages below the dielectric breakdown voltage.

As in reference Chen non filamentary ReRAM cells such as bulk switching or area switching can also exhibit a HRS/LRS characteristics, however with ion implantation these ReRAM cells can be improved in reproducibility, durability and uniformity using techniques discussed in this patent application.

Figure 5A:
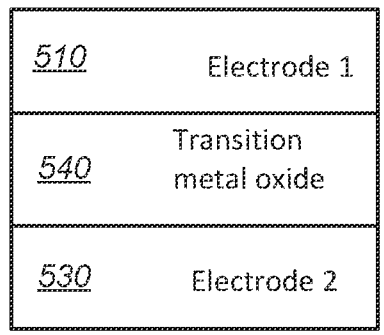
FIG. 5A shows a simple partial cross section schematic of a ReRAM structure, according to some embodiments.

FIG. 5A shows a simple partial cross section schematic of a ReRAM structure, according to some embodiments. ReRAM structure includes electrode 1 (510) and electrode 2 (530), with transition metal oxide layer 540 between electrode 1 (510) and electrode 2 (530). The transition metal oxide 540 can be Stoichiometric, and in some cases can be non-stoichiometric and where the transition metal oxide can comprise metal oxide and/or combinations of metal oxides such as Ti oxide, Ta oxide, V oxide, Ni oxide, Hf oxide, Mo oxide, W oxide to name a few. Electrode 1 (510) and electrode 2 (530) can be Si, poly Si, and/or amorphous Si that can be heavily doped with P and/or N dopant, and in some cases can be silicide, such as Al silicide, metal such as Al, Pt, Ti, Cu, W to name a few.

Figure 5B:
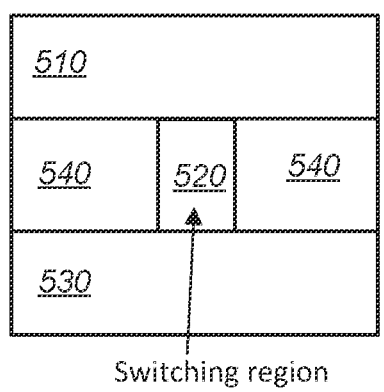
FIGS. 5B and 5C are simple partial cross sections of ReRAM material which has been selective ion implanted, according to some embodiments.
Figure 5C:
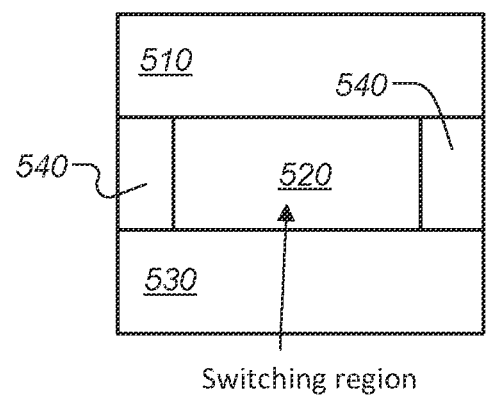

FIGS. 5B and 5C are simple partial cross sections of ReRAM material which has been selective ion implanted, according to some embodiments. The ion implant can be with inert ions such as He, Ar, Ne, Kr, and in some cases ions such as O, and transition metal ions, and any combination thereof. In some cases, in the case of stoichiometric layer, Ti oxide switching layer for example the selective ion implantation of Ar ions can break the bonds between the Ti atoms and the O atoms, resulting in ReRAM switching characteristics in region 520, without the necessity of a breakdown voltage to initiate the ReRAM switching characteristics. This is just one example and other examples of transition metal that are stoichiometric and/or non-stoichiometric can be applied. In ReRAM characteristics the switching current are important and by defining the switching volume the switching current can be controlled to 10 microamperes or less and in some cases less than 1 microamperes.

FIG. 5C is similar to FIG. 5B in the case of very small ReRAM devices for example 100 nm×100 nm or less, and in some cases 10 nm×10 nm. The switching volume 520 can occupy between 1-90% of the volume between electrode 1 (510) and electrode 2 (530), and in some cases can occupy 100% the volume between electrode 1 (510) and electrode 2 (530).

Transition metal oxide switching layers have been discussed as an example. However in some cases transition metal nitride, transition metal carbide, transition metal sulfide and other switching material can be applicable to selective ion implantation to generate a well-defined switching region that will not require dielectric breakdown voltages or breakdown voltages.

The thickness of the switching region 520 can range from 1 nm-20 nm, and in some cases 5 nm-100 nm, and in some cases greater than 100 nm.

The ion implant energy and/or dose can be a single energy and/or a single dose, and in some cases multiple energies and/or multiple doses. The ion implant energy can range from 1 KeV-100 KeV or more and in some cases the ion implant energy can be less than 1 KeV. The dose can range from $10^6/cm^2$-$10^{20}/cm^2$.

In the case of oxidation—reduction switching layers consisting of transition metal oxide, the implantation of ions such as Ar for example can break the bonds of transition metal and oxygen which can be thought of as an equivalent to reduction. The selective implantation can create a path of defects which can be thought of as a bond breakage between transition metal and its oxygen ions which can be thought of as equivalent to reduction. This bond breakage in either stoichiometric or non stoichiometric switching layers can result in ReRAM memory characteristic upon biasing the ReRAM with a voltage below that of the dielectric breakdown voltage. In other switching layers that are not transition metal oxide based reduction can also occur with an introduction of implanted ions.

The ions implanted to break the bonds can include inert ions such as Ar, He, Kr, Ne, to name a few or any other ions in the periodic table which can include transition metal ions, O, N, S, C to name a few.

Using ion implantation to from a defect channel as discussed in this application can also be applied to Conductive Bridge RAM (CBRAM).

Figure 5D:
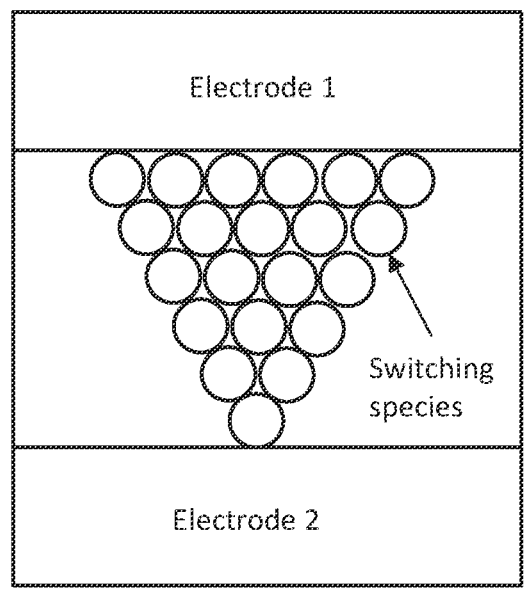
FIG. 5D is a simple partial schematic of a prior art ReRAM.

FIG. 5D is a simple partial schematic of a prior art ReRAM. The structure shown in FIG. 5D uses a forming process/dielectric breakdown to initiate the formation of switching filament(s) where the size and location of the switching filament(s) are not defined, and therefore controlling the switching current is difficult in some cases the switching current can be 200 microamps or higher and is not desirable for high density nonvolatile memory applications.

Figure 5E:
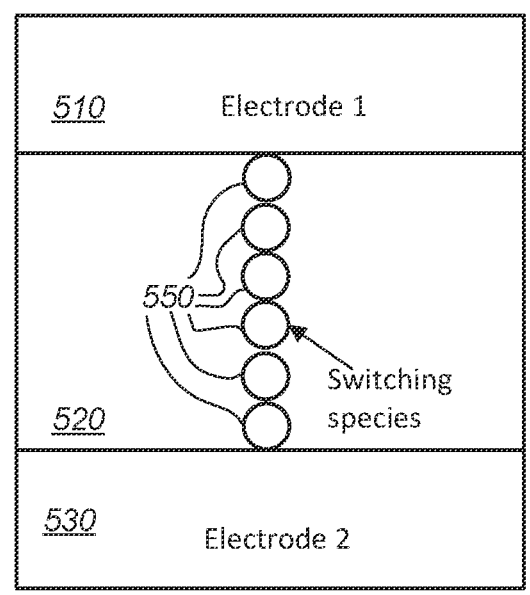
FIG. 5E is a simple partial schematic cross section of a ReRAM using ion implantation to define the switching region, according to some embodiments.

FIG. 5E is a simple partial schematic cross section of a ReRAM using ion implantation to define the switching region, according to some embodiments. Ion implantation definition of the switching region 520 can enable ReRAM characteristics without a dialectic breakdown process also known as forming process in the literature. The switching species 550 or switching region 520 can be well defined by ion implantation, and therefore the switching current can be controlled to 10 microamps or less, and in some cases to 1 microamp or less. The switching layer can be stoichiometric, and in some cases non stoichiometric, and in some cases crystalline, and in some cases non crystalline oxides of Si and/or transition metal ions such as Mo, V, Ti, Ta, W, Hf to name a few, and in some cases oxides of Al, and nitrides of Si, Al, W, Mo, to name a few. Ion implantation of inert ions such as He, Xe, Ar, can be used to reduce transition metal ion oxides to transition metal ions. In some cases, additional switching species such as transition metal ions, O, N, can be implanted to generate the switching region or filament region, and in some cases the process can introduce additional transition metal ions, O ions, N ions, as switching species into the switching layer.

Electrode 1 and electrode 2 layers 510 and 530, respectively, can contain one or more layers in addition to the electrodes where the additional layers can be a semiconductor that can be doped or undoped to provide a rectifying junction, and the electrodes can be metallic and/or Si silicide for example such as Al silicide, and can be polycrystalline and/or amorphous.

Figure 6A:
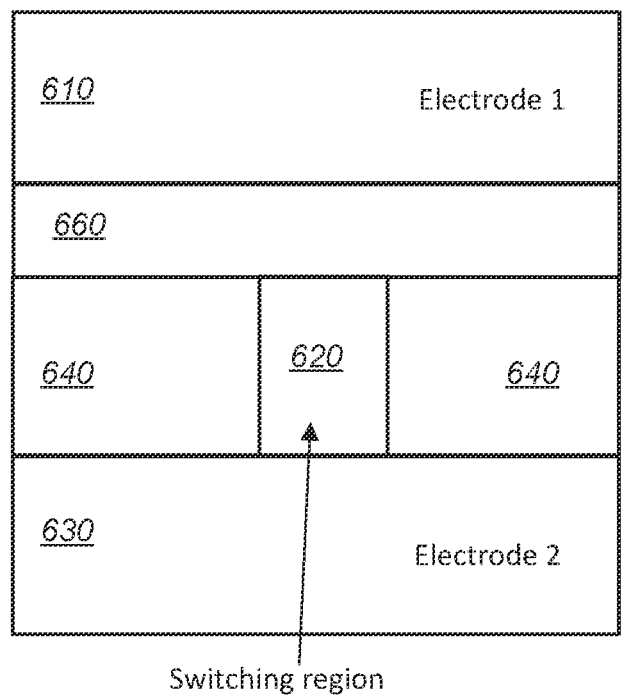
FIGS. 6A and 6B show simple partial cross sections of a ReRAM memory cell, according to some embodiments.
Figure 6B:
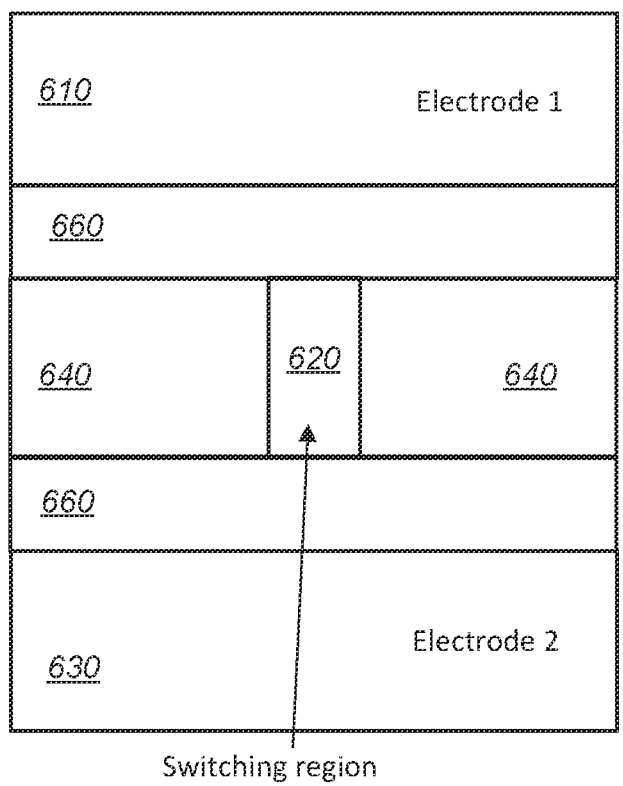

FIGS. 6A and 6B show simple partial cross sections of a ReRAM memory cell, according to some embodiments. The ReRAM memory cell can include a semiconductor layer 660 (FIG. 6A) or layers 660 (FIG. 6B) between the electrodes 610, 630 and the switching layer 640. The switching region 620 is shown formed within layer 640. The semiconductor 660 can be crystalline Si, polycrystalline Si, amorphous Si, Ge, Ge alloy, poly crystalline Ge, amorphous Ge and/or other semiconductors.

The semiconductor layer 660 thickness can range from 1-100 nm, and in some cases greater than 100 nm. The semiconductor layer can provide a rectifying junction between the conducting filament and the semiconductor interface. This rectifying junction can prevent shorting of the conductive element or region to the electrode which can result in a failure of the ReRAM cell. In addition, the rectifying characteristics can also alleviate sneak current that can degrade the performance of ReRAM arrays.

In some cases, the switching region can be defined by selective ion implantation of switching species such as O, Ti, Ta, W, V, Zr, Cr, to name a few for the case of switching with transition metal ions and transition metal oxides. Other switching mechanisms in other material systems such as nitride or carbide based can be similarly adapted. In addition, phase change memories can also be similarly adapted however possibly without the need of a reduction selective ion implant to alleviate the requirement of forming process or breakdown voltage to initiate memory characteristics.

Figure 7A:
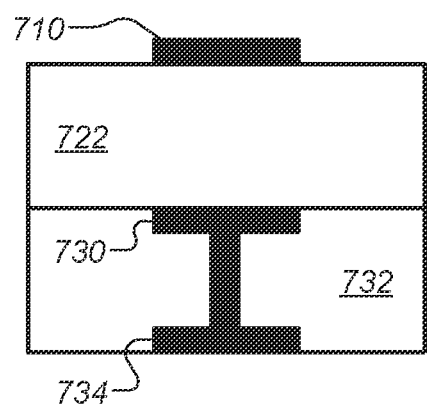
FIGS. 7A-7D are partial simple cross section schematics of a memory cell such as a resistive random access memory ReRAM cell at various stages of processing, according to some embodiments.

FIGS. 7A-7D are partial simple cross section schematics of a memory cell such as a resistive random access memory ReRAM cell at various stages of processing, according to some embodiments. FIG. 7A shows a partial simple cross section schematic of a memory cell such as a resistive random access memory ReRAM cell prior to defining its switching region. The layer 722 is between the top electrode TE 710 and bottom electrode BE 730. BE 730 is shown formed within a dielectric/oxide layer 732 with connecting electrode 734 for 3D stacking. For further details, see, Lee et al, Three-Dimensional Shared Memory Fabricated Using Wafer Stacking Technology, IEEE IEDM 2000, which is incorporated by reference herein. Layer 722 can be an insulator dielectric such as silicon dioxide, silicon nitride, aluminum oxide, aluminum nitride to name a few for example and in some cases high resistivity crystalline and or polycrystalline and or amorphous semiconductor such as silicon for example with resistivity equal or greater than 10 ohm-cm and in some cases equal or greater than 100 ohm-cm and in some cases equal or greater than 1000 ohm-cm. The layer thickness 722 between TE and BE can range from 1 nm to 100 nm and in some cases 1-20 nm. In some cases the layer 722 thickness can be less than one nanometer nm. The top electrode TE 710 and bottom electrode BE 730 can be a metal such as Pt, Cu, Au, Al, for example with thickness ranging from 1 nm to 100 nm and can be thickened in subsequent processing steps. The width of TE 710 and BE 730 can range from 10 nm to 1000 nm or more, in some cases 100 nm to 5000 nm or more. In some cases the TE 710 and BE 730 can be doped semiconductors with n and or p doping. The TE 710 and BE 730 can be connected in a crossbar manner to form a memory array.

Figure 7B:
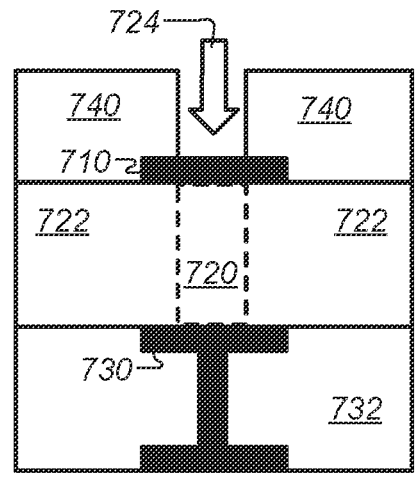

FIG. 7B shows a simple partial cross section schematic of a ReRAM cell prepared for selective ion implantation 724 where a mask 740 of dielectric, metal, and or polymer is formed on the cell surface with an open aperture over regions 720 to be ion implanted with switching species such as O, Ti, Ta, Ni, Cr, W, V, Hf, Mo, Nb, Zr to name a few at implant energies that can penetrate the top electrode TE 710 and go into the insulator or semi insulating layer 722 between TE and BE and can penetrate into and in some cases beyond BE 730. The ion implant energy, depending on ion mass can range from 1-400 KeV and n some cases greater than 400 KeV. O, Ti, V ions for example at 50 KeV can penetrate approximately 30 nm into silicon with a straggle of approximately 10 nm. Dose can range from $1E14/cm^2$ to $1E18/cm^2$ to optimize switching characteristics. A rapid thermal anneal can be implemented to activate implanted ions.

The aperture in the ReRAM for selective ion implant can have a lateral dimension range of 1 nm to 1000 nm and n some cases 50 nm to 5000 nm.

Figure 7C:
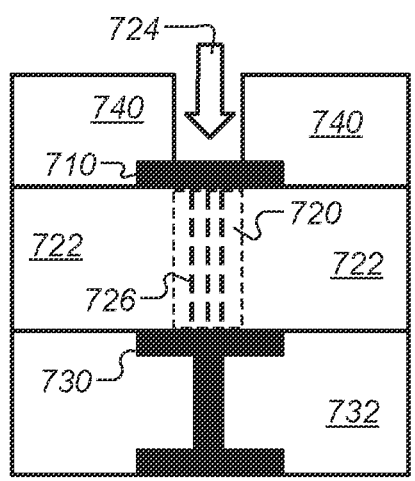

FIG. 7C shows a partial simple schematic cross section of a ReRAM cell that can use additional selective ion implantation into the same switching region 720 formed in FIG. 7B by selective ion implantation. Implanting Ar, Xe, and or additional switching ion species 726 such as O, Ti, Ta, V, Cr, Ni, Mo, W, Hf to name a few, can cause a reduction (oxidation reduction of transition metal oxide responsible for On Off characteristics of ReRAM) of transition metal oxides such that a voltage breakdown process can be avoided to initiate the switching process in the ReRAM. Accelerating energy range can be 1-400 KeV and dose can range from $1E14/cm^2$ to $1E18/cm^2$ to optimize switching characteristics.

Figure 7D:
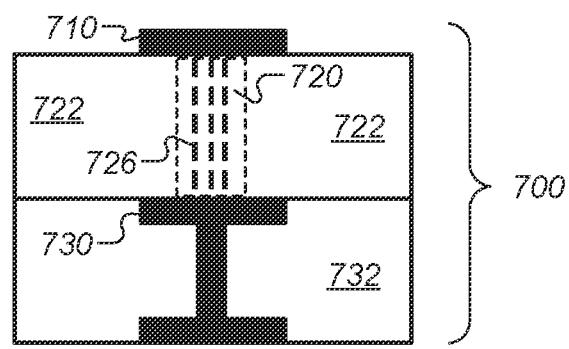

FIG. 7D shows a simple partial cross section schematic of a ReRAM cell 700 where the switching region 720 is formed in an insulator and or semiconductor 722 and can have multiple layers of insulator and or semiconductors by selective ion implantation of switching species/ions and neutral ions 726 such as Ar, Ne, He, Xe to name a few. In some cases, the additional ion implant of neutral ions 726 may not be necessary.

The voltage to initial switching using ion implantation for reduction of transition metal oxides is less than a comparable ReRAM cell that does not use ion implantation for reduction of transition metal oxides and instead reles on forming process/dielectric breakdown process.

This patent application refers to certain theories in explaining the nature and operation of devices, but it should be clear that such theories are based on current understanding and do not affect the actual operation of the disclosed devices even if future developments prove the theories incorrect. This patent specification also refers to numerical ranges of parameters, and it should be understood that insubstantial departures from such ranges are still within the spirit of the disclosed advancements.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

What is claimed is:

1. A stacked device comprising:
   an active transistor circuit (120);
   a resistive random-access memory (110) stacked on and integrated with the active transistor circuit and comprising:
     top (510) and bottom (530) electrodes and a switching layer (540) between the top electrode and the bottom electrode;
     a switching region (520) that is within said switching layer and is laterally flanked by portions of said switching layer that are not a switching region;
     wherein said switching region is formed by ion implantation into the switching layer through at least one of the top electrode and bottom electrode;
     wherein said switching region is configured to switch between high and low electrical conductivity in response to the application of a switching voltage without a need of applying a breakdown voltage to form said switching region; and
   a connecting electrode (734) electrically coupling at least one of the top electrode and the bottom electrode to the active transistor circuit.

2. The stacked device of claim 1, in which said switching region has a substantially constant cross-section from one to the other of said top and bottom electrodes.

3. The stacked device of claim 1, in which the switching region is formed by implanting switching species into a non-switching material.

4. The stacked device of claim 1, in which the switching layer is a non-switching material and the switching region is formed by selective ion implantation in said non-switching material to cause the switching region to have a width in a plane intermediate the top and bottom electrodes that controls the value of a switching current of the device.

5. The stacked device of claim 1, in which selected ions are implanted into the switching region to break or reduce an oxygen bond from a transition metal ion switching species.

6. The stacked device of claim 1, in which Argon, Xenon, and/or Neon ions have been implanted in said switching region to break or reduce an oxygen bond from a transition metal ion switching species.

7. A stacked device comprising:
an active transistor circuit (120);
a resistive random access memory (110) stacked on and integrated with the active transistor circuit and comprising:
  top (510) and bottom (530) electrodes and a layer of non-switching material (520) into which switching species have been implanted to form a switching channel (520);
  wherein said material has an area in planes along said top and bottom electrodes and said switching channel area in said planes is less than that of said material;
  wherein said switching channel is configured to switch between high and low electrical conductivity in response to the application of a switching voltage below a breakdown voltage without a need of applying a breakdown voltage to form said switching channel; and
a connecting electrode (734) electrically coupling at least one of the top electrode and the bottom electrode to the active transistor circuit.

8. The stacked device of claim 7, in which said area of said switching channel is selected to control current flowing through the channel when the channel is in a state of high conductivity.

9. The stacked device of claim 7, in which said area of said switching channel is selected to control a value of a switching voltage sufficient to change the channel between high and low conductivity.

10. The stacked device of claim 7, in which Argon, Xenon, and/or Neon ions have been implanted in said switching region to break or reduce an oxygen bond from a transition metal ion switching species.

11. The stacked device of claim 7, in which said switching species have been implanted through at least one of said top and bottom electrodes.

12. The stacked device of claim 7, in which said switching channel has a substantially constant cross-section from one to the other of said top and bottom electrodes.

13. A method of forming a stacked device, comprising:
providing a stack of a semiconductor material having a first layer (722) for a resistive random-access memory and a second layer (732) for an active transistor circuit;
forming a connecting electrode (734) that extends from a region of the second layer toward a region of the first layer and a bottom electrode that is at a region of the first layer and merges with a top of said connecting electrode and top electrode at an upper region of the first layer;
ion implanting through the top electrode and into the material of the first layer to form a switching region (720) extending from the top to the bottom electrodes and flanked by said material of the first layer at least on two sides;
wherein said switching region is configured to switch between high and low electrical conductivity in response to the application of a switching voltage without a need of applying a breakdown voltage to form said switching region; and
wherein the step of forming the switching region comprises forming the switching region with a substantially constant width from said top electrode to said bottom electrode.

14. The method of claim 13, including bonding said first and second layers to each other.

15. The method of claim 13, further including selecting said width of the switching region to match a selected switching voltage for switching the switching region between said high and low conductivities.

16. The method of claim 13, further including selecting said width of the switching region to match a selected current flow through said switching region in a state thereof of said high conductivity.

17. The method of claim 13, in which said providing the first layer comprises providing a layer of a non-switching material and said ion implanting comprises implanting switching species in said first layer to thereby form or complete said switching region.

18. The method of claim 13, further including implanting Argon, Xenon, and/or Neon ions in said switching region to break or reduce an oxygen bond from a transition metal ion switching species.

19. A method of forming a stacked device, comprising:
providing a stack of a semiconductor material having a first layer (722) for a resistive random-access memory and a second layer (732) for an active transistor circuit;
wherein said first layer is a non-switching material;
forming a connecting electrode (734) that extends from a region of the second layer toward a region of the first layer and a bottom electrode (730) that is at a region of the first layer and merges with a top of said connecting electrode and a top electrode (710) at an upper region of the first layer;
ion implanting switching species through the top electrode and into the material of the first layer to form a switching region (720) extending from the top to the bottom electrodes and flanked by said non-switching material of the first layer at least on two sides;
wherein said switching region is configured to switch between high and low electrical conductivity in response to the application of a switching voltage without a need of applying a breakdown voltage to form said switching region.

20. The method of claim 19, in which the step of forming the switching region comprises forming the switching region with a substantially constant width from said top electrode to said bottom electrode.

* * * * *